(12) United States Patent
Hwu

(10) Patent No.: US 9,075,245 B2
(45) Date of Patent: Jul. 7, 2015

(54) OPTICAL MODULE FOR X-RAY MICROSCOPE

(71) Applicant: ACADEMIA SINICA, Nankang, Taipei (TW)

(72) Inventor: En-Te Hwu, Taipei (TW)

(73) Assignee: ACADEMIA SINICA, Nankang, Taipei (TW)

( * ) Notice: Subject to any disclaimer, the term of this patent is extended or adjusted under 35 U.S.C. 154(b) by 255 days.

(21) Appl. No.: 13/733,421

(22) Filed: Jan. 3, 2013

(65) Prior Publication Data
US 2013/0188249 A1 Jul. 25, 2013

(30) Foreign Application Priority Data
Jan. 20, 2012 (TW) .............................. 101102687 A

(51) Int. Cl.
| | |
|---|---|
| G02B 21/28 | (2006.01) |
| G02B 7/02 | (2006.01) |
| G21K 7/00 | (2006.01) |
| H01J 37/15 | (2006.01) |

(52) U.S. Cl.
CPC ........ *G02B 21/28* (2013.01); *G02B 7/02* (2013.01); *G02B 7/028* (2013.01); *G21K 7/00* (2013.01); *H01J 37/15* (2013.01)

(58) Field of Classification Search
CPC .......... G02B 21/28; G02B 7/02; G02B 7/028; G21K 7/00; H01J 37/15
USPC ........ 359/382, 820, 822; 250/492.1; 378/205, 378/207, 208
See application file for complete search history.

(56) References Cited

U.S. PATENT DOCUMENTS

| | | | | |
|---|---|---|---|---|
| 5,153,434 A | * | 10/1992 | Yajima et al. | 250/311 |
| 6,552,449 B2 | * | 4/2003 | Tsuboi et al. | 310/12.06 |
| 6,690,764 B2 | * | 2/2004 | Kondo | 378/119 |
| 6,765,205 B2 | * | 7/2004 | Ochiai et al. | 850/9 |
| 6,781,753 B2 | | 8/2004 | Gunderson | |
| 7,043,848 B2 | * | 5/2006 | Hollman et al. | 33/556 |
| 7,180,317 B2 | * | 2/2007 | Hollman | 324/750.08 |
| 7,239,107 B1 | * | 7/2007 | Ferreira et al. | 318/649 |
| 7,331,714 B2 | * | 2/2008 | Shu et al. | 378/208 |
| 7,792,246 B2 | * | 9/2010 | Rodenburg et al. | 378/43 |
| 8,168,947 B2 | * | 5/2012 | Suhara | 250/306 |
| 8,222,618 B2 | * | 7/2012 | Tokuda et al. | 250/492.1 |
| 8,267,388 B2 | * | 9/2012 | Xu | 269/60 |
| 8,353,628 B1 | * | 1/2013 | Yun et al. | 378/207 |
| 8,878,147 B2 | * | 11/2014 | Robinson | 250/492.1 |
| 2003/0098964 A1 | * | 5/2003 | Lee et al. | 355/73 |

FOREIGN PATENT DOCUMENTS

| | | |
|---|---|---|
| CN | 1808205 A | 7/2006 |
| CN | 201017090 Y | 2/2008 |

* cited by examiner

*Primary Examiner* — Frank Font
(74) *Attorney, Agent, or Firm* — Muncy, Geissler, Olds & Lowe, P.C.

(57) ABSTRACT

An optical module includes at least a carrying stage, at least an actuator unit and at least an optical assembly. The carrying stage has a first aperture. The actuator unit is disposed at one side of the carrying stage and has a second aperture. The optical assembly is connected with the actuator unit, and the actuator unit adjusts the position of the optical assembly. A radiated wave enters from one side of the optical module and passes through the first aperture, the second aperture and the optical assembly. A microscope with the optical module has compact size and is easily assembled and carried. The optical module and microscope can efficiently reduce the effect of ambient temperature variations so as to improve the measuring stability thereof.

28 Claims, 11 Drawing Sheets

OPTICAL MODULE FOR X-RAY MICROSCOPE

CROSS REFERENCE TO RELATED APPLICATIONS

This Non-provisional application claims priority under 35 U.S.C. §119(a) on Patent Application No(s). 101102687 filed in Taiwan on Jan. 20, 2012, the entire contents of which are hereby incorporated by reference.

BACKGROUND OF THE INVENTION

1. Field of Invention

The present invention relates to an optical module and a microscope.

2. Related Art

In recent years, optical microscope imaging technology has very impressive progress in image resolution, contrast and quality due to the excellent property of synchronizing radiated lights. In specific, a small amount of light radiation is able to obtain high quality optical microscope images and animations. Moreover, the microscope imaging technology with utilizing electromagnetic wave can be applied to not only the research and analysis of materials science, but also the biological and medical researches.

The conventional X-ray microscope is very large, so in some cases, it needs a container for overseas transportation. During the assembling of the conventional X-ray microscope, all actuator units and optical assemblies are individually fixed on an optical table (e.g. a stainless steal optical table). Since various actuator systems and optical elements have different shapes, heights and arrangements, the environmental temperature change may easily cause the thermal expansion issue of the X-ray microscope, thereby seriously affecting the measurement in nanometer scales and the positioning accuracy. For example, when the environmental temperature rises for 1° C., the expansion amount of a 1 cm$^3$ aluminum cube in any of X, Y and Z directions is about 220 nm.

FIG. 1 is a schematic diagram showing one component of a conventional X-ray microscope, which includes an optical assembly 11 and a corresponding actuator unit 12 fixed on a stage 13. In this case, the optical assembly 11 is a pin hole element. The optical assembly 11 is disposed over the actuator unit 12, and the actuator unit 12 is disposed on the stage 13. The actuator assembly 11 includes an X-direction actuator element 121a, a Y-direction actuator element 121b, and a Z-direction actuator element 121c, which are overlapped along one direction. The actuator elements 121a, 121b and 121c can control the optical assembly 11 to move in the X, Y and Z directions, respectively. X ray passes through the center of the optical assembly 11 (the pin hole).

As shown in FIG. 1, when the environmental temperature is increased, the optical assembly 11, the actuator unit 12 and the stage 13 will have thermal expansions in the Z direction, which causes the optical assembly 11 (pin hole) to lift to a higher position (as indicated by dotted line). In this case, the shifting distance of the center of the optical assembly 11 (pin hole) is D. On the contrary, when the environmental temperature is decreased, the optical assembly 11, the actuator unit 12 and the stage 13 will be lowered along the Z direction, which causes the center of the optical assembly 11 (pin hole) to descend to a lower position. These undesired lifting and descending of all components will sufficiently decrease the measuring stability of the X-ray microscope.

Therefore, it is an important subject of the present invention to provide an optical module and a microscope that can ignore the environmental temperature variation and thus improve the measuring stability.

SUMMARY OF THE INVENTION

In view of the foregoing subject, an objective of the present invention is to provide an optical module and a microscope that is not sensitive to the environmental temperature variation and thus improve the measuring stability.

To achieve the above objective, the present invention discloses an optical module including at least a carrying stage, at least an actuator unit and at least an optical assembly. The carrying stage has a first aperture. The actuator unit is disposed at one side of the carrying stage and has a second aperture. The optical assembly is connected with the actuator unit, and the actuator unit adjusts a position of the optical assembly. A radiated wave enters from one side of the optical module and passes through the first aperture, the second aperture and the optical assembly.

In one embodiment, the shape of the first aperture and the second aperture comprises a circle or a polygon.

In one embodiment, a projection of the first aperture covers a first geometric center of the carrying stage, and a protection of the second aperture covers a second geometric center of the actuator unit.

In one embodiment, the radiated wave substantially passes through the first geometric center and the second geometric center.

In one embodiment, the shape of the carrying stage comprises a circle, a star or a polygon.

In one embodiment, the optical assembly comprises a shutter, a condenser, a pin hole, a sample plate, a zone plate, phase ring, Bertrand lens, CCD (charge coupled device), or their combinations.

In one embodiment, when the optical module comprises two optical assemblies, the optical assemblies are disposed at opposite sides of the carrying stage.

In one embodiment, when the optical module comprises two optical assemblies, the optical assemblies and the actuator unit are disposed at the same side or two opposite sides of the calving stage.

In one embodiment, the actuator unit comprises at least a piezoelectric actuator or at least a stepper motor.

In one embodiment, when the actuator unit comprises a plurality of piezoelectric actuators or stepper motors, the piezoelectric actuators or the stepper motors are overlapped.

In one embodiment, the optical assembly has a third aperture, and the radiated wave also passes through the third aperture.

In one embodiment, when multiple optical modules are arranged, the optical paths of the optical modules are substantially the same.

In one embodiment, when the optical module comprises two carrying stages, the optical module further comprises a connecting element, and the carrying stages are disposed at opposite sides of the connecting element, respectively.

In one embodiment, the shape of the connecting element comprises a cylinder or a rod.

In one embodiment, the connecting element comprises a material with low thermal expansion coefficient.

In one embodiment, the carrying stage has a fixing structure engaged with the connecting element.

To achieve the above objective, the present invention also discloses a microscope including at least an optical module. The optical module includes at least a carrying stage, at least an actuator unit and at least an optical assembly. The carrying stage has a first aperture. The actuator unit is disposed at one side of the carrying stage and has a second aperture. The optical assembly is connected with the actuator unit, and the actuator unit adjusts a position of the optical assembly. A radiated wave enters from one side of the microscope and passes through the first aperture, the second aperture and the optical assembly of the optical module.

In one embodiment, the shape of the first aperture and the second aperture comprises a circle or a polygon.

In one embodiment, when the optical module comprises two optical assemblies, the optical assemblies are disposed at opposite sides of the carrying stage.

In one embodiment, when the optical module comprises two optical assemblies, the optical assemblies and the actuator unit are disposed at the same side or two opposite sides of the carrying stage.

In one embodiment, when the actuator unit comprises a plurality of actuator elements, the actuator elements are overlapped.

In one embodiment, the optical assembly has a third aperture, and the radiated wave also passes through the third aperture.

In one embodiment, when the microscope comprises a plurality of optical modules, the optical paths of the optical modules are substantially the same.

In one embodiment, when the optical module comprises two carrying stages, the optical module further comprises a connecting element, and the carrying stages are disposed at opposite sides of the connecting element, respectively.

In one embodiment, the shape of the connecting element comprises a cylinder or a rod.

In one embodiment, the carrying stage has a fixing structure engaged with the connecting element.

In one embodiment, the microscope further comprises a protection element, and the optical modules are disposed within the protection element.

In one embodiment, the microscope is an X-ray microscope or an electron microscope.

As mentioned above, the optical module of the invention includes at least a carrying stage, at least an actuator unit and at least an optical assembly. The carrying stage has a first aperture, and the actuator unit has a second aperture. A radiated wave enters from one side of the optical module or microscope and passes through the first aperture, the second aperture and the optical assembly. Accordingly, when the environmental temperature is changed to cause the thermal expansions of the carrying stage, the actuator unit and the optical assembly, the radiated wave should substantially pass through the first aperture of the carrying stage and the second aperture of the actuator unit. This configuration is not sensitive to the environmental temperature variation and thus remains the measuring stability. In addition, the modulated design of the optical module can decrease the assembling or disassembling time, and make it easier to carry or transport the microscope or optical module(s).

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1:
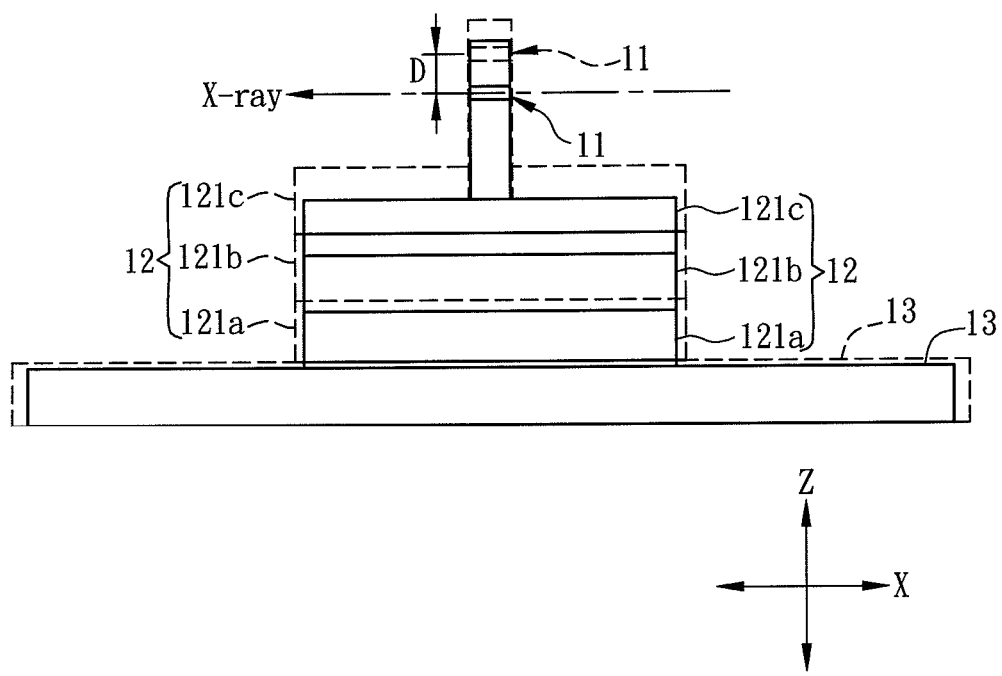
FIG. 1 is a schematic diagram showing a conventional X-ray microscope, which includes an optical assembly, a corresponding actuator unit and a stage.
Figure 2A:
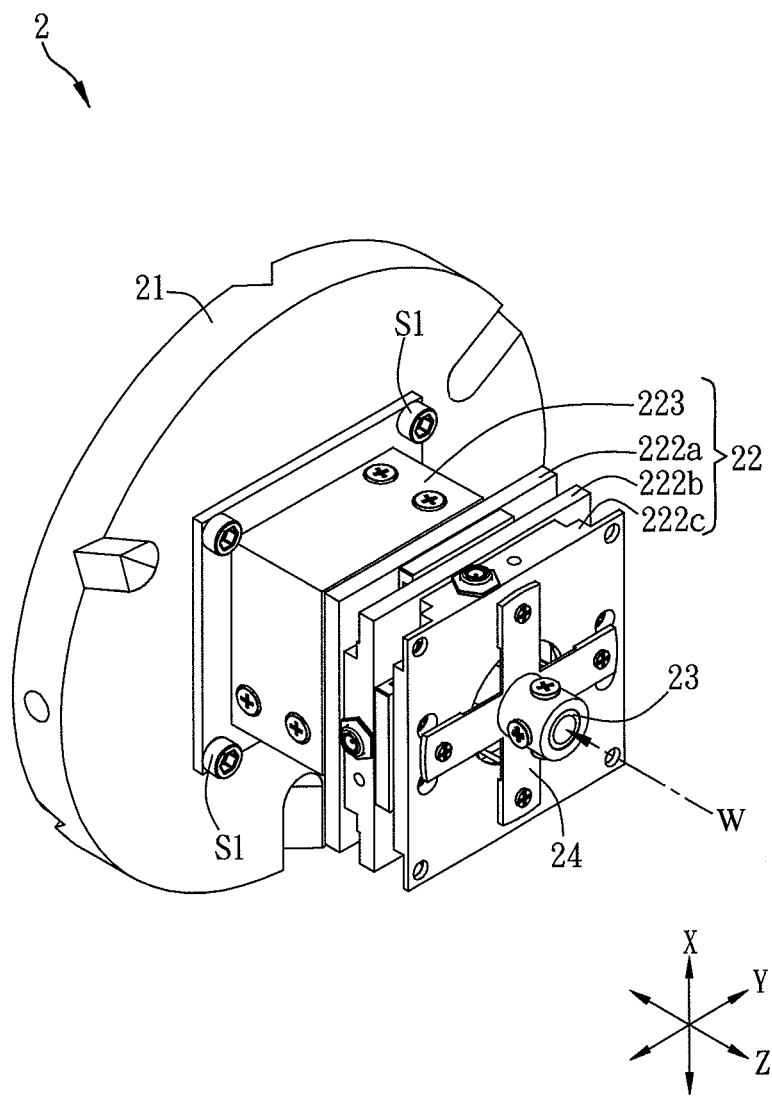
FIG. 2A is a schematic diagram of an optical module according to a preferred embodiment of the present invention.
Figure 2B:
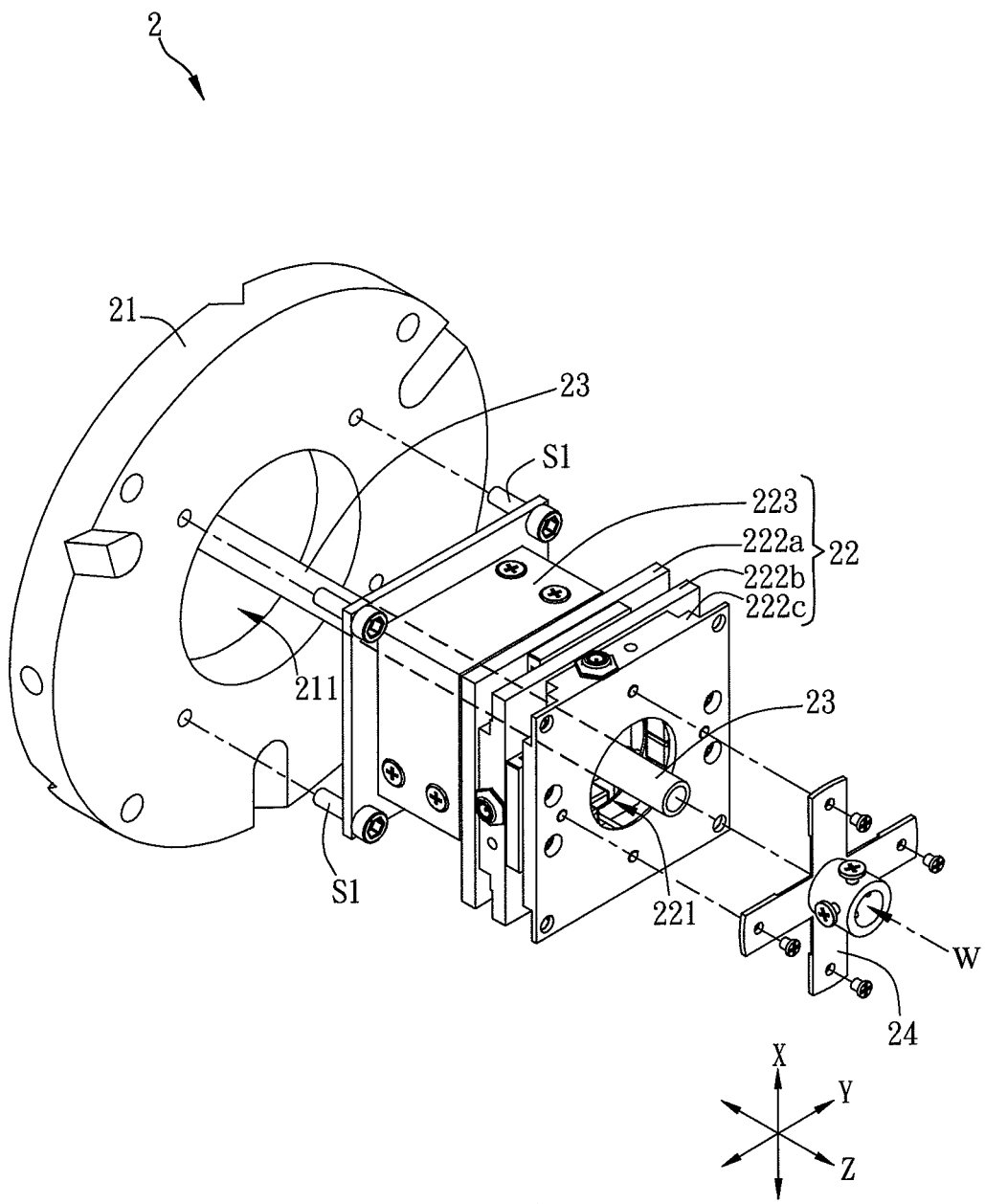
FIG. 2B is an exploded view of the optical module of FIG. 2A.

FIG. 2A is a schematic diagram of an optical module 2 according to a preferred embodiment of the present invention, and FIG. 2B is an exploded view of the optical module 2.

Referring to FIGS. 2A and 2B, the optical module 2 includes at least a carrying stage 21, at least an actuator unit 22 and at least an optical assembly 23. In this embodiment, the optical module 2 includes a carrying stage 21, an actuator unit 22 and an optical assembly 23.

The carrying stage 21 has a first aperture 211. The carrying surface of the carrying stage 21 has a point symmetric shape such as a circle, a star (a concave polygon), a polygon, or the likes. In this embodiment, the shape of the carrying surface of the carrying stage 21 is a circle, and the center of the first aperture 211 and the center of the circle are substantially at the same location. Of course, the invention is not limited to this, and in other aspects, the shape of the carrying stage 21 can be a star, a polygon or the likes.

The actuator unit 22 is disposed at one side of the carrying stage 21 and has a second aperture 221. For example, the actuator unit 22 is located at the center of the right side of the carrying stage 21 and screwed on the surface of the carrying stage 21. The shape of the actuator unit 22 is, for example, a circle, a polygon or the likes. In this embodiment, the shape of the actuator unit 22 is a square. In addition, the shapes of the first aperture 211 of the carrying stage 21 and the second aperture 221 of the actuator unit 22 can be a circle or a polygon. In this embodiment, the shapes of the first aperture 211 and the second aperture 221 are a circle.

The actuator unit 22 includes at least one actuator element, which can be a piezoelectric actuator or a stepper motor. In this embodiment, the actuator unit 22 includes three actuator elements 222a, 222b and 222c. The actuator elements 222a, 222b and 222c are piezoelectric actuators, and are overlapped. In this embodiment, the actuator elements 222a, 222b and 222c are the shift adjusting elements in X, Y and Z directions, respectively. The actuator elements 222a, 222b and 222c are disposed on a base 223, so that the actuator elements 222a, 222b and 222c can be fixed on the carrying stage 21 by the base 223 and several screws S1. Herein, the actuator unit 22 is disposed at the right side of the carrying stage 21.

The optical assembly 23 is connected with the actuator unit 22, and the actuator unit 22 adjusts the position of the optical assembly 23. For example, the optical assembly 23 may include a shutter, a condenser, a pin hole, a sample plate, a zone plate, a phase ring, a Bertrand lens, a CCD (charge coupled device), or the likes, or their combinations. In this embodiment, the optical assembly 23 is a condenser holder tube. The optical assembly 23 penetrates through the first aperture 211 and the second aperture 221, and is locked by a cross-shaped fixing assembly 24 so as to connect one end of the condenser holder tube to the actuator unit 22. Accordingly, the actuator elements 222a, 222b and 222c can respectively adjust the movements of the optical assembly 23 in X, Y and Z directions.

When the optical module 2 comprises two optical assemblies 23, the optical assemblies 23 are disposed at opposite sides of the carrying stage 21. In other words, the left and right sides of the carrying stage 21 are configured with an optical assembly 23. Besides, when the optical module 2 comprises two optical assemblies 23, the optical assemblies 23 and the actuator unit 22 are disposed at the same side or two opposite sides of the carrying stage 21. To be noted, in other aspects, the actuator unit 22 may further include another actuator element (not shown) for driving the optical assembly 23 to rotate.

A radiated wave W enters from one side of the optical module 2 and passes through the first aperture 211 of the carrying stage 21, the second aperture 221 of the actuator unit 22, and the optical assembly 23. The radiated wave W can be a light wave or an electron beam. In this embodiment, the radiated wave W is an X-ray. To be noted, if the optical assembly 23 is a lens (e.g. a Bertrand lens), the radiated wave W is capable of passing through the lens.

Figure 2C:
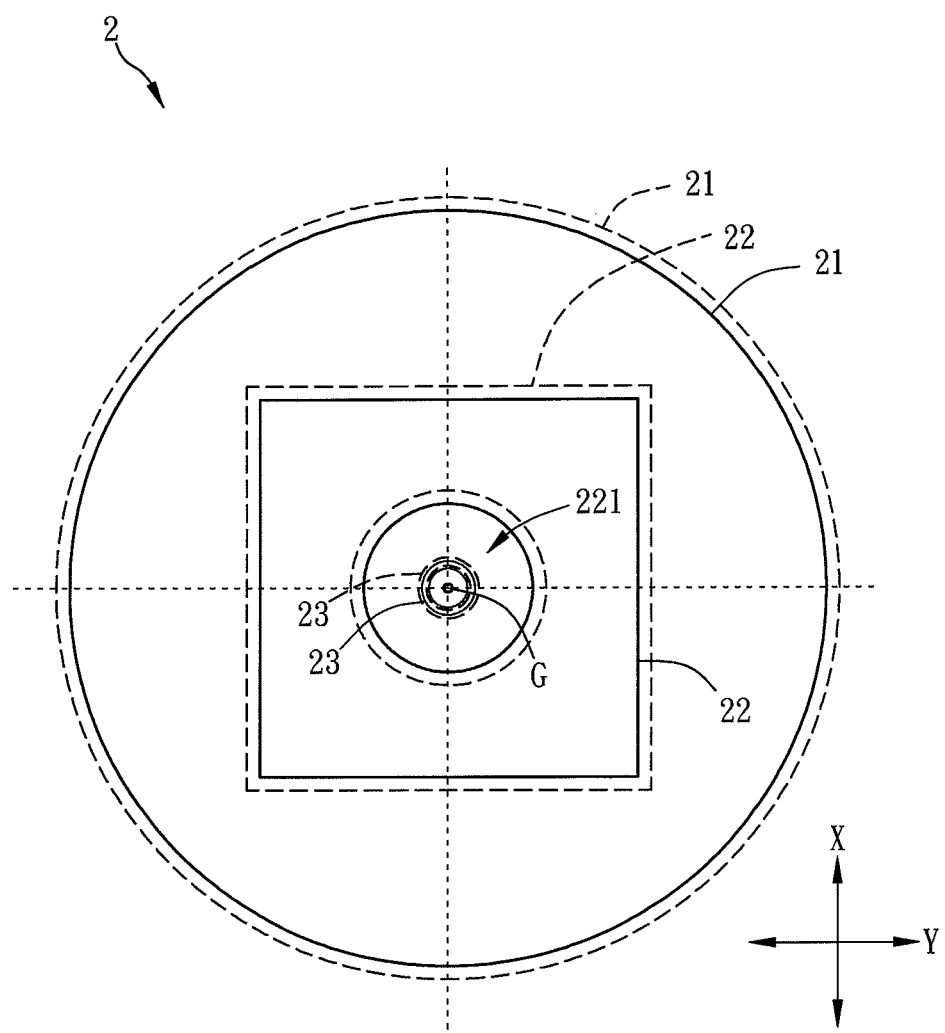
FIG. 2C is a front view of the optical module of FIG. 2A.

FIG. 2C is a front view of the optical module 2 of FIG. 2A. To make the following description more comprehensive, FIG. 2C only shows the appearances of the carrying stage 21, the actuator unit 22 and the optical assembly 23, while the recesses or apertures of the carrying stage 21 and the actuator unit 22 as well as the fixing assembly 24 are not shown.

Referring to FIGS. 2B and 2C, the projection of the first aperture 211 (the projection direction is the same as the direction of the radiated wave W) covers a first geometric center of the carrying stage 21, and the protection of the second aperture 221 covers a second geometric center of the actuator unit 22. The first and second geometric centers are the geometric centers of the carrying stage 21 and the actuator unit 22, respectively. The radiated wave W (not shown) substantially passes through the first and second geometric centers. In this embodiment, the shape of the carrying stage 21 is a circle (a point symmetric shape), and the shape of the actuator unit 22 is a square. Thus, the first and second geometric centers are in the same point symmetry center G, and the radiated wave W substantially penetrates the optical module 2 through the point symmetry center G. The entire optical module 2 has a symmetric structure, so that the undesired thermal expansion issue can be sufficiently reduced. As shown in FIG. 2C, when the environmental temperature of the optical module 2 changes (increases), the carrying stage 21, actuator unit 22 and optical assembly 23 will together expand to the positions indicated by the dotted lines. The radiated wave W can still substantially pass through the first and second point symmetry centers (point symmetry center G), and the environmental temperature change can be ignored. As a result, the environmental temperature change will not affect the measuring stability of the optical module 2.

Figure 3A:
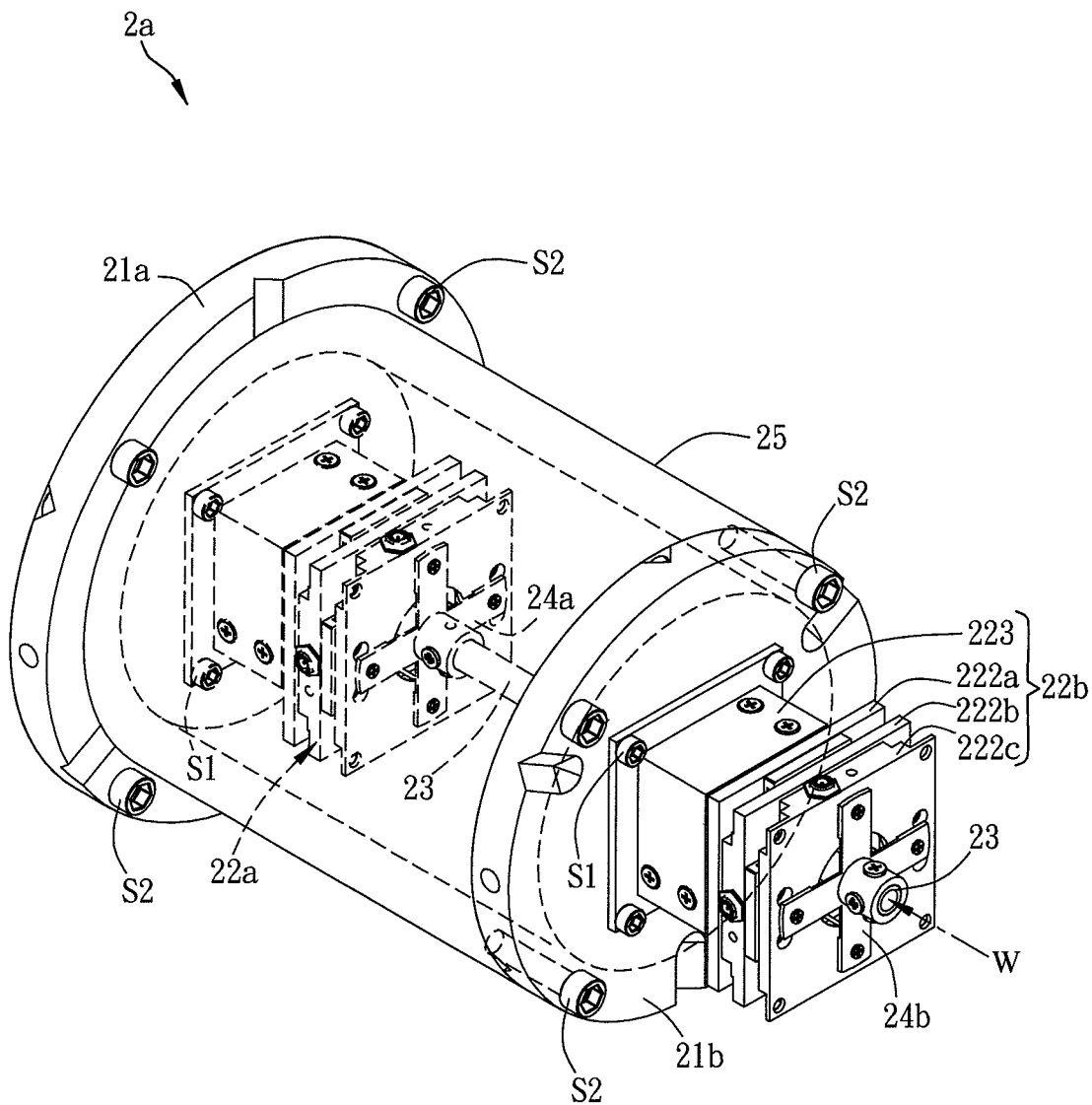
FIGS. 3A and 3B are schematic diagrams showing different aspects of the optical module of the invention.
Figure 3B:
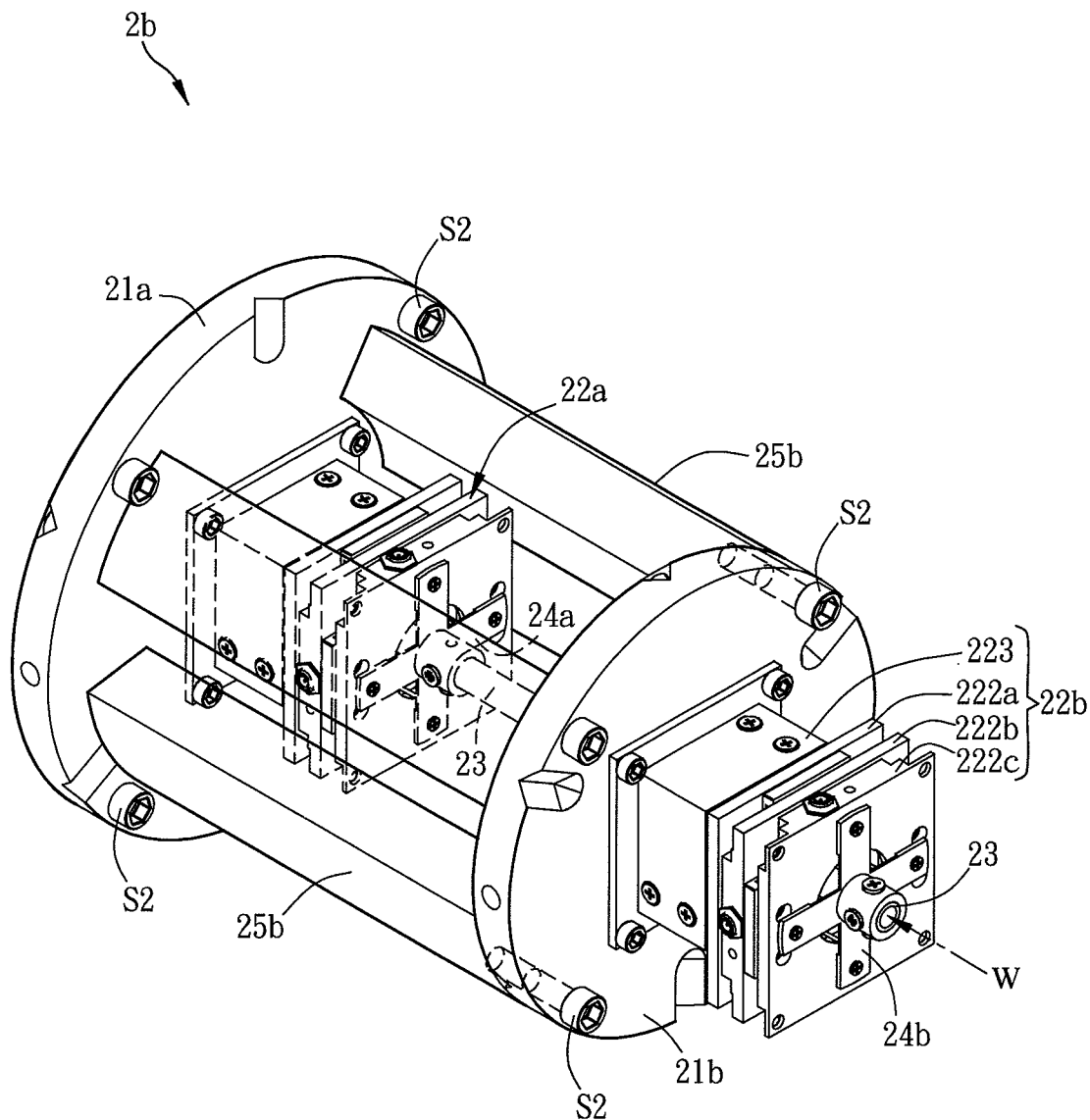

FIGS. 3A and 3B are schematic diagrams showing different aspects (optical modules 2a and 2b) of the invention.

Different from the above-mentioned optical module 2, the optical module 2a of FIG. 3A includes two carrying stages 21a and 21b and two actuator units 22a and 22b. The actuator units 22a and 22b are disposed at the right sides of the carrying stages 21a and 21b, respectively. Two ends of the optical assembly 23 are screwed on the actuator units 22a and 22b by the fixing assemblies 24a and 24b.

The optical module 2a further includes a connecting element 25, and the carrying stages 21a and 21b are disposed at opposite sides of the connecting element 25, respectively. The shape of the connecting element 25 comprises a cylinder or multiple rods, and is fit to the carrying stages 21a and 21b. In this embodiment, the shape of the connecting element 25 is a cylinder. The connecting element 25 is connected with the carrying stages 21a and 21b by screwing, adhering, locking, wedging or the likes. In this case, the connecting element 25 is connected with the carrying stages 21a and 21b by screws S2. Besides, the connecting element 25 may contain a material with low thermal expansion coefficient, such as carbon fiber, metal, ceramics, or the likes.

Different from the optical module 2a, the optical module 2b of FIG. 3B has a connecting element 25b including four connecting rods (FIG. 3B only shows three connecting rods). Of course, the number of the connecting rods can also be two or more than two.

The other features of the optical modules 2a and 2b can be referred to the optical module 2, so the detailed descriptions thereof will be omitted.

Figure 4A:
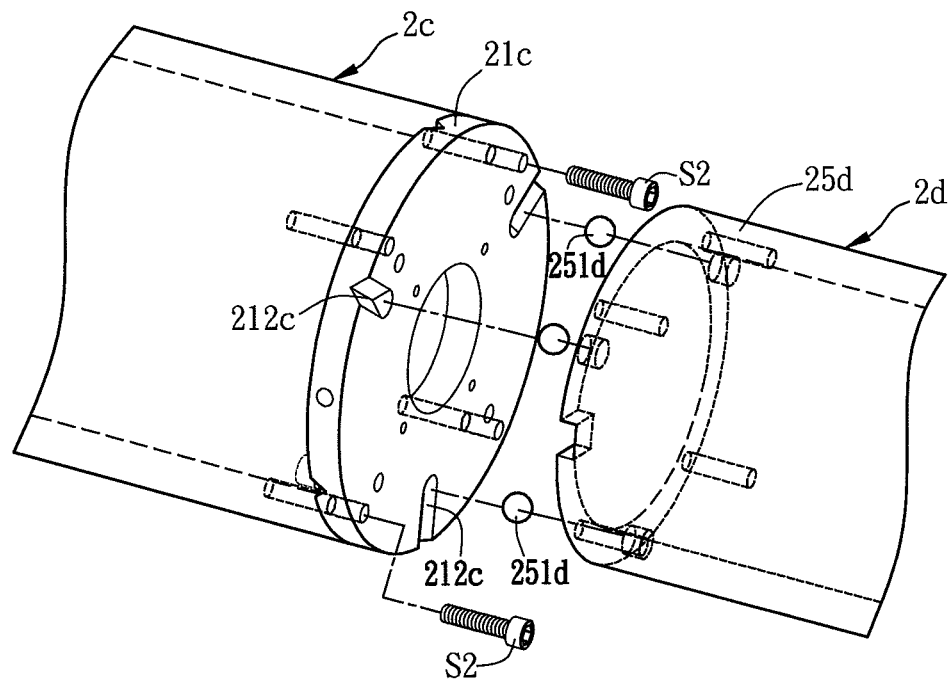
FIG. 4A is a partial exploded view of a carrying stage of an optical module and a connecting element of another optical module.
Figure 4B:
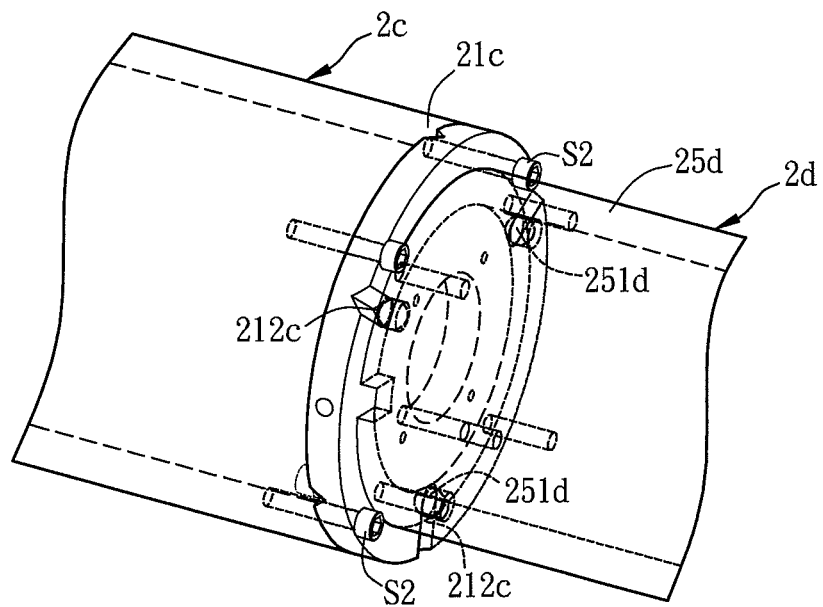
FIG. 4B is a partial assembled view of a carrying stage of an optical module and a connecting element of another optical module.

FIG. 4A is a partial exploded view of a carrying stage 21c of an optical module 2c and a connecting element 25d of another optical module 2d, and FIG. 4B is a partial assembled view of the carrying stage 21c of the optical module 2c and the connecting element 25d of the optical module 2d. To make the following descriptions more comprehensive, the corresponding actuator units and optical assemblies of the optical modules 2c and 2d are not shown in FIGS. 4A and 4B. Herein, the connecting element 25d is a cylinder. The diameter of the connecting element 25d of the optical module 2d is smaller than the diameter of the carrying stage 21c of the optical module 2c.

When multiple optical modules are applied, the carrying stage may further include a fixing structure, which can be engaged with the connecting element for speeding the assembling and center alignment time of the optical modules. The fixing structure applies kinematic mounting mechanism that can automatically align the center of the optical modules to the correct positions so as to facilitate the assembling process. As shown in FIG. 4A, the carrying stage 21c of the optical module 2c has a plurality of recesses 212c, and the connecting element 25d has a plurality of protrusions 251d corresponding to the recesses 212c. In other aspects, the carrying stage 21c of the optical module 2c may have a plurality of protrusions, and the connecting element 25d may have a plurality of recesses corresponding to the protrusions (not shown). In this embodiment, the carrying stage 21c has three recesses 212c, and the connecting element 25d has three protrusions 251d. The recess 212c is a V-shaped trench, and the protrusion 251d includes a pin ball. In this case including three recesses 212c and three protrusions 251d, when two protrusions 251d are aligned and connected to two corresponding recesses 212c, the residual protrusion 251c is also aligned and connected to the third recess 212c. In other embodiments, different kinematic mounting fixing structures can also be applied to align and fix the carrying stage 21c and the connecting element 25d.

When multiple optical modules are applied, the configuration of the fixing structure can help to easily connect the carrying stage with a connecting element of another optical module, thereby decreasing the assembling or disassembling time of the optical modules. Besides, when the number as well as the entire size of the optical modules increases, the optical modules can be easily disassembled, carried and transported.

Figure 5:
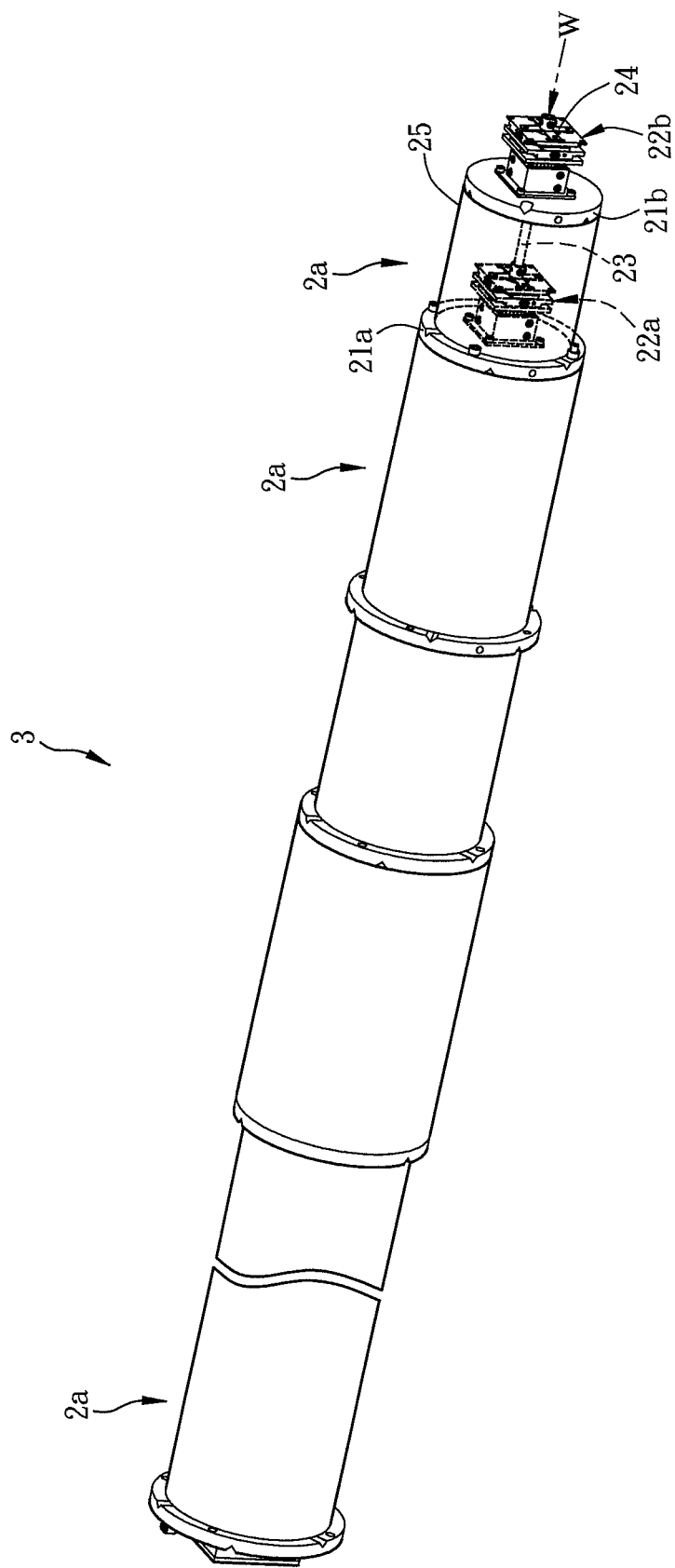
FIG. 5 is a schematic diagram showing a microscope according to a preferred embodiment of the present invention.

FIG. 5 is a schematic diagram showing a microscope 3 according to a preferred embodiment of the present invention.

The microscope 3 includes at least an optical module 2a. Referring to FIG. 5, the microscope 3 includes five optical modules 2a. The features and structures of the optical module 2a and the connecting element 25 are disclosed hereinabove, so the detailed descriptions thereof will be omitted. In addition, a Y-shaped stand or frame can be provided to support the microscope 3, so that the microscope 3 can be installed on an optical table for performing measurement. To be noted, the stand, frame and optical table are not shown in FIG. 5.

In this embodiment, the microscope 3 is an X-ray microscope, and the radiated wave W is an X-ray. The wavelength of the X-ray is between 0.001 nm and 10 nm. Since the X-ray has short wavelength, it can easily penetrate the atomic lattice of an object, which makes the object like transparent. The element with larger atomic number has more external electrons, so the X-ray is much easier to be blocked so as to generate dark image. The feature allows nondestructively detecting the internal structure of an object by observing the gray-level contrast and dark/bright areas of the image. This nondestructively detection is a major advantage of the X-ray microscope. In other embodiments, the microscope 3 may be an electron microscope such as a scanning electron microscope (SEM) or a transmission electron microscope (TEM).

The radiated wave W enters from one side of the microscope 3 (right side in FIG. 5) and passes through the first apertures of the carrying stages, the second apertures of the actuator units, and the optical assemblies of the optical modules 2a. In this case, the optical modules 2a are modulated, so that the assembling or disassembling time of the microscope 3 can be decreased and the user can easily carry and transport the microscope 3.

Figure 6:
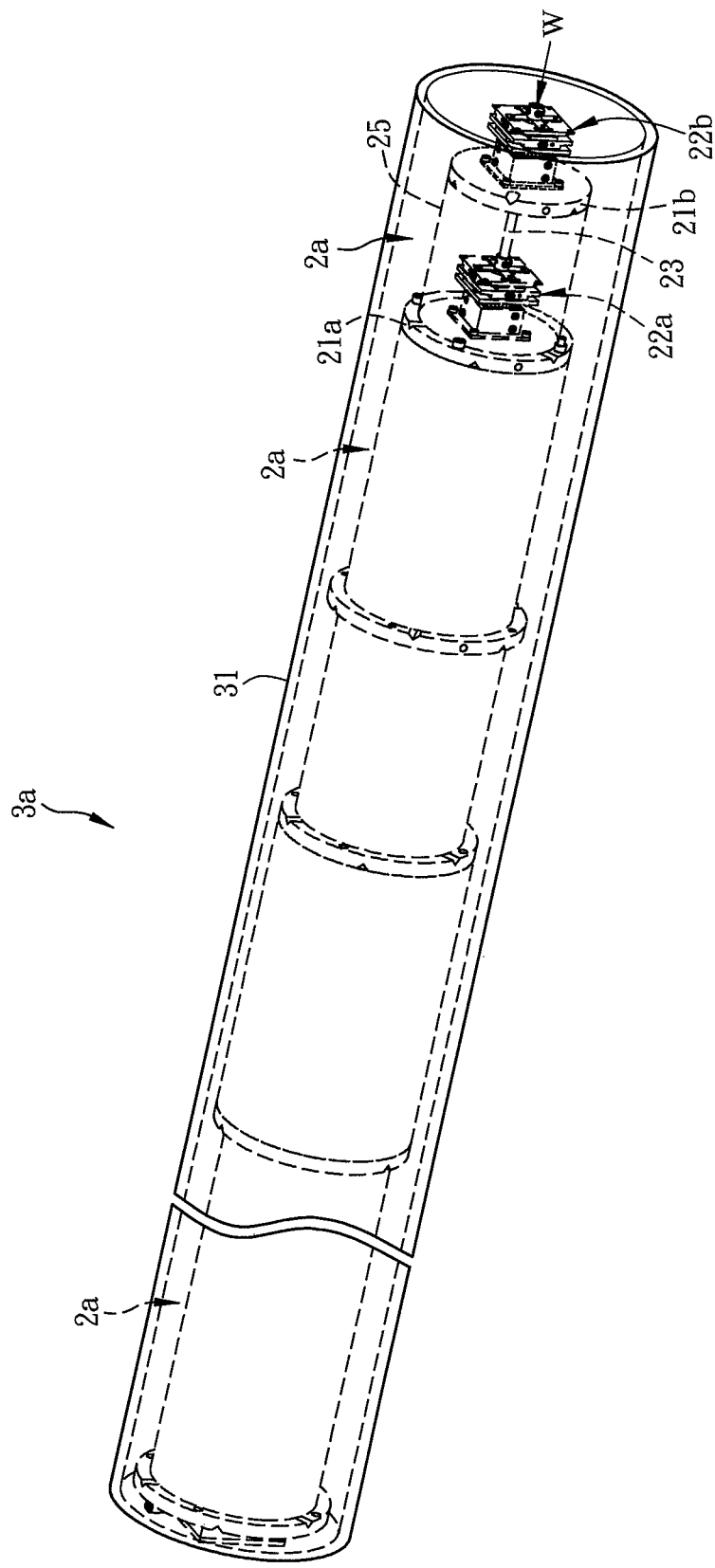
FIG. 6 is a schematic diagram showing another microscope according to the preferred embodiment of the present invention.

FIG. 6 is a schematic diagram showing another microscope 3a according to the preferred embodiment of the present invention.

Different from the microscope 3 of FIG. 5, the microscope 3a of FIG. 6 further includes a protection element 31 (e.g. a cylindrical container), and the optical modules 2a are disposed within the protection element 31. Excepting for protecting the microscope 3a, the protection element 31 may further contain inert gas (e.g. helium or nitrogen) for decreasing energy loss of the traveling radiated wave W. Otherwise, the protection element 31 may be vacuumed, heated or cooled, so that the microscope 3a can be equipped with the function of environment or temperature control.

Figure 7A:
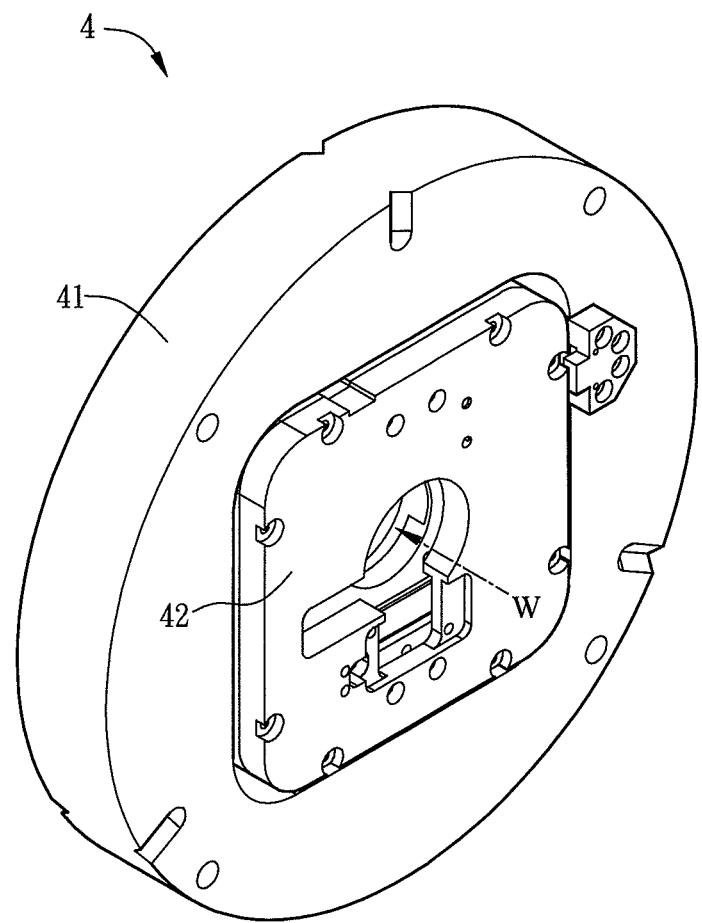
FIGS. 7A and 7B are schematic diagrams showing an optical module according to another embodiment of the present invention.
Figure 7B:
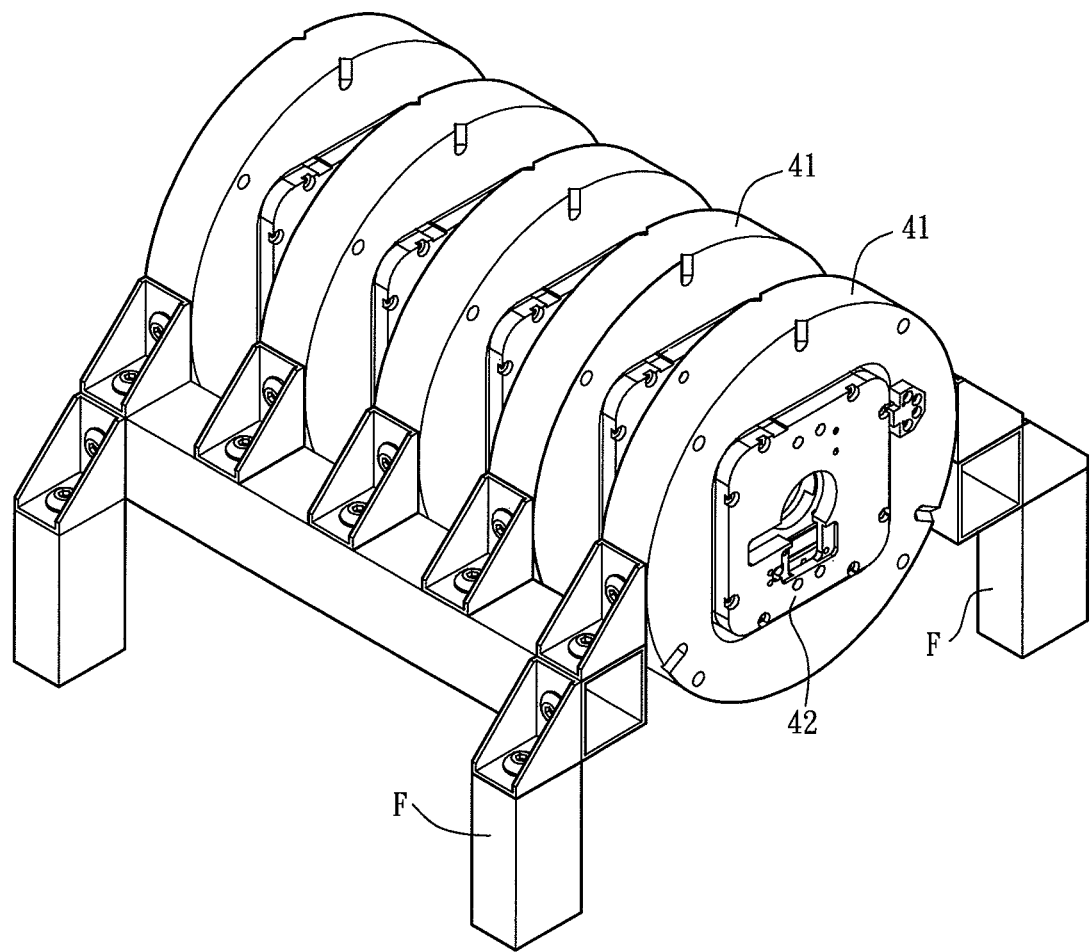

FIGS. 7A and 7B are schematic diagrams showing an optical module 4 according to another embodiment of the present invention. To make the following description more comprehensive, the optical assembly is not shown in FIGS. 7A and 7B. As shown in FIG. 7A, the optical module 4 includes at least a carrying stage 41, at least an actuator unit 42, and at least an optical assembly (not shown). In this embodiment, the optical module 4 includes one carrying stage 41 and one actuator unit 42. Different form the aspect of FIG. 2A, the actuator unit 42 is thinner, so it can be at least partially embedded into the center hole of the carrying stage 41. This configuration can reduce the total thickness of the carrying stage 41 and the actuator unit 42. As shown in FIG. 7B, multiple carrying stages 41 and multiple actuator units 42 are assembled on a horizontal line for example, and a frame F is provided to fix the relative distances of the carrying stages 41.

In summary, the optical module of the invention includes at least a carrying stage, at least an actuator unit and at least an optical assembly. The carrying stage has a first aperture, and the actuator unit has a second aperture. A radiated wave enters from one side of the optical module or microscope and passes through the first aperture, the second aperture and the optical assembly. Accordingly, when the environmental temperature is changed to cause the thermal expansions of the carrying stage, the actuator unit and the optical assembly, the radiated wave should substantially pass through the first aperture of the carrying stage and the second aperture of the actuator unit. This configuration can ignore the environmental temperature variation and thus remain the measuring stability. In addition, the modulated design of the optical module can decrease the assembling or disassembling time, and make it easier to carry or transport the microscope or optical module(s).

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. An optical module, comprising:
   at least a carrying stage having a first aperture;
   at least an actuator unit disposed at one side of the carrying stage and having a second aperture; and
   at least an optical assembly connected with the actuator unit, wherein the actuator unit adjusts a position of the optical assembly, and a radiated wave enters from one side of the optical module and passes through the first aperture, the second aperture and the optical assembly.

2. The optical module of claim 1, wherein the shape of the first aperture and the second aperture comprises a circle or a polygon.

3. The optical module of claim 1, wherein a projection of the first aperture covers a first geometric center of the carrying stage, and a protection of the second aperture covers a second geometric center of the actuator unit.

4. The optical module of claim 3, wherein the radiated wave substantially passes through the first geometric center and the second geometric center.

5. The optical module of claim 1, wherein the shape of the carrying stage comprises a circle, a star or a polygon.

6. The optical module of claim 1, wherein the optical assembly comprises a shutter, a condenser, a pin hole, a sample plate, a zone plate, phase ring, Bertrand lens, CCD (charge coupled device), or any combinations thereof.

7. The optical module of claim 1, wherein when the optical module comprises two optical assemblies, the optical assemblies are disposed at opposite sides of the carrying stage.

8. The optical module of claim 1, wherein when the optical module comprises two optical assemblies, the optical assemblies and the actuator unit are disposed at the same side or two opposite sides of the carrying stage.

9. The optical module of claim 1, wherein the actuator unit comprises at least a piezoelectric actuator or at least a stepper motor.

10. The optical module of claim 9, wherein when the actuator unit comprises a plurality of piezoelectric actuators or stepper motors, the piezoelectric actuators or the stepper motors are overlapped.

11. The optical module of claim 1, wherein the optical assembly has a third aperture, and the radiated wave also passes through the third aperture.

12. The optical module of claim 1, wherein optical paths of a plurality of the optical modules are substantially the same.

13. The optical module of claim 1, wherein when the optical module comprises two carrying stages, the optical module further comprises a connecting element, and the carrying stages are disposed at opposite sides of the connecting element, respectively.

14. The optical module of claim 13, wherein the shape of the connecting element comprises a cylinder or multiple rods.

15. The optical module of claim 13, wherein the connecting element comprises a material with low thermal expansion coefficient.

16. The optical module of claim 13, wherein the carrying stage has a kinematic fixing structure engaged with the connecting element.

17. A microscope comprising at least an optical module, the optical module comprising:
 at least a carrying stage having a first aperture;
 at least an actuator unit disposed at one side of the carrying stage and having a second aperture; and
 at least an optical assembly connected with the actuator unit, wherein the actuator unit adjusts a position of the optical assembly, and a radiated wave enters from one side of the microscope and passes through the first aperture, the second aperture and the optical assembly of the optical module.

18. The microscope of claim 17, wherein the shape of the first aperture and the second aperture comprises a circle or a polygon.

19. The microscope of claim 17, wherein when the optical module comprises two optical assemblies, the optical assemblies are disposed at opposite sides of the carrying stage.

20. The microscope of claim 17, wherein when the optical module comprises two optical assemblies, the optical assemblies and the actuator unit are disposed at the same side or two opposite sides of the carrying stage.

21. The microscope of claim 17, wherein when the actuator unit comprises a plurality of actuator elements, the actuator elements are overlapped.

22. The microscope of claim 17, wherein the optical assembly has a third aperture, and the radiated wave also passes through the third aperture.

23. The microscope of claim 17, wherein when the microscope comprises a plurality of optical modules, optical paths of the optical modules are substantially the same.

24. The microscope of claim 17, wherein when the optical module comprises two carrying stages, the optical module further comprises a connecting element, and the carrying stages are disposed at opposite sides of the connecting element, respectively.

25. The microscope of claim 24, wherein the shape of the connecting element comprises a cylinder or multiple rods.

26. The microscope of claim 24, wherein the carrying stage has a kinematic fixing structure engaged with the connecting element.

27. The microscope of claim 23, further comprising a protection element, wherein the optical modules are disposed within the protection element.

28. The microscope of claim 17, which is an X-ray microscope or an electron microscope.

* * * * *